(12) United States Patent
Zhang (10) Patent No.: US 10,697,624 B2
(45) Date of Patent: Jun. 30, 2020

(54) APPARATUS FOR HEAT EXCHANGE BY USING BRAIDED FABRIC WOVEN FROM THERMALLY CONDUCTIVE WIRE MATERIAL

(71) Applicant: Yixing Zhang, Beijing (CN)

(72) Inventor: Yixing Zhang, Beijing (CN)

( * ) Notice: Subject to any disclaimer, the term of this patent is extended or adjusted under 35 U.S.C. 154(b) by 114 days.

(21) Appl. No.: 15/760,504

(22) PCT Filed: Sep. 30, 2016

(86) PCT No.: PCT/CN2016/101041
§ 371 (c)(1),
(2) Date: Mar. 15, 2018

(87) PCT Pub. No.: WO2017/045651
PCT Pub. Date: Mar. 23, 2017

(65) Prior Publication Data
US 2018/0274771 A1    Sep. 27, 2018

(30) Foreign Application Priority Data

Sep. 17, 2015  (CN) .......................... 2015 1 0596062

(51) Int. Cl.
*F21V 29/67*    (2015.01)
*F21V 29/503*    (2015.01)
(Continued)

(52) U.S. Cl.
CPC .............. *F21V 29/503* (2015.01); *D04C 1/02* (2013.01); *D04C 1/06* (2013.01); *F21S 8/08* (2013.01);
(Continued)

(58) Field of Classification Search
CPC ........ F21V 29/503; F21V 29/67; F21V 29/70; F21V 29/89; D04C 1/02; D04C 1/06;
(Continued)

(56) References Cited

U.S. PATENT DOCUMENTS

| 2,433,239 A * | 12/1947 | Rasero | ................... H01B 7/083 |
| | | | 139/385 |
| 2003/0178414 A1* | 9/2003 | DeAngelis | ............. D02G 3/441 |
| | | | 219/545 |

(Continued)

FOREIGN PATENT DOCUMENTS

| CN | 201062773 Y | 5/2008 |
| CN | 201349385 Y | 11/2009 |

(Continued)

*Primary Examiner* — Bao Q Truong
(74) *Attorney, Agent, or Firm* — Novick, Kim & Lee, PLLC; Allen Xue (57) ABSTRACT

There are provided an apparatus for heat exchange by using a braided fabric woven from a thermally conductive wire material and a light emitting diode (LED) lighting device. The apparatus comprises a braided fabric (1) woven from a thermally conductive wire material, and a heat dissipating or absorbing object (2) is fixed with the braided fabric (1) by using methods such as welding, adhering with a thermally conductive adhesive and casting, so as to ensure that heat energy is effectively conducted between the heat dissipating or absorbing object (2) and the thermally conductive wire of the braided fabric (1), and heat is dissipated to air or absorbed from air by means of a heat dissipating surface of the thermally conductive wire of the braided fabric (1).

3 Claims, 6 Drawing Sheets

(51) Int. Cl.
    *F21V 29/70*    (2015.01)
    *F21V 29/89*    (2015.01)
    *H05K 7/20*     (2006.01)
    *F21S 8/08*     (2006.01)
    *D04C 1/02*     (2006.01)
    *D04C 1/06*     (2006.01)
    *F28F 13/00*    (2006.01)
    *H01L 33/64*    (2010.01)
    *F21Y 115/10*   (2016.01)
    *F21W 131/103*  (2006.01)

(52) U.S. Cl.
    CPC .............. *F21S 8/085* (2013.01); *F21V 29/67* (2015.01); *F21V 29/70* (2015.01); *F21V 29/89* (2015.01); *F28F 13/003* (2013.01); *H01L 33/641* (2013.01); *H01L 33/648* (2013.01); *H05K 7/20* (2013.01); *D10B 2101/20* (2013.01); *D10B 2401/04* (2013.01); *F21W 2131/103* (2013.01); *F21Y 2115/10* (2016.08); *F28F 2250/08* (2013.01); *F28F 2255/02* (2013.01)

(58) Field of Classification Search
    CPC .. F21S 8/08; F21S 8/085; F28F 13/003; F28F 2250/08; F28F 2255/02; H01L 33/641; H01L 33/648; H05K 7/20; F21Y 2115/10; F21W 2131/103; D10B 2101/20; D10B 2401/04
    See application file for complete search history.

(56) References Cited

U.S. PATENT DOCUMENTS

2010/0035000 A1* 2/2010 Kirth ..................... A44C 17/02
                                                           428/35.2
2017/0198422 A1* 7/2017 Ishikawa ............... D03D 15/02

FOREIGN PATENT DOCUMENTS

| | | |
|---|---|---|
| CN | 201697079 U | 1/2011 |
| CN | 104124331 A | 10/2014 |
| CN | 204083890 U | 1/2015 |
| CN | 204593143 U | 8/2015 |
| CN | 105228423 A | 1/2016 |
| CN | 205245105 U | 5/2016 |
| EP | 2527730 A1 | 11/2012 |
| JP | 2005085490 A | 3/2005 |

\* cited by examiner

APPARATUS FOR HEAT EXCHANGE BY USING BRAIDED FABRIC WOVEN FROM THERMALLY CONDUCTIVE WIRE MATERIAL

TECHNICAL FIELD

The present invention belongs to the field of heat conduction, in particular to an apparatus for heat exchange.

BACKGROUND

In general, the so-called heat dissipation is eventuality always to dissipate heat to air. However, whether convection or thermal radiation is related to the surface area of a heat dissipating surface of an object. Now, with the increase of a power of a heat generating element, in order to increase the surface area of the heat dissipating surface of a heat sink, the heat sink is becoming bigger and more bulky, but the efficiency is relatively low. In particular, a distance from the heat generating element to the heat dissipating surface is greatly increased while the heat dissipating surface is increased, such that the temperature difference required for heat transfer over this distance is also greatly increased. This makes heat dissipation of some elements such as a high-power LED chip reach at a dead end and currently become a key obstacle to rapid development of LED lighting.

As another aspect of heat exchange, heat absorption is exactly the same.

SUMMARY

In order to effectively solve the above problem, the present invention provides an apparatus for heat exchange by utilizing a braided fabric woven from a thermally conductive wire material, a specific technical solution of which is as follows.

There is provided an apparatus for heat exchange by utilizing a braided fabric woven from a thermally conductive wire material. The apparatus includes a thermally conductive braided fabric woven from a thermally conductive wire material with a diameter d, wherein 0.01 mm≤d≤2 mm; and a heat generating object or heat absorbing object is connected onto the thermally conductive braided fabric by means of welding, adhering with a thermally conductive adhesive and casting.

Further, the braided fabric as a whole includes a metal frame formed by die-casting or welding.

Further, the thermally conductive braided fabric as a whole has a pocket-like structure with an opening, and a blower is disposed at the opening.

Further, the thermally conductive braided fabric with the pocket-like structure is monolayer or multilayer.

Further, the thermally conductive braided fabric is fixed on an inner wall of a pipe needing heat exchange, and the inner wall of the pipe is made of a thermally conductive material.

Further, the thermally conductive braided fabric is fixed on an outer wall of the pipe capable of circulating air or other fluids, and the outer wall of the pipe is made of a thermally conductive material.

Further, the thermally conductive braided fabric is respectively fixed on an inner wall and an outer wall of the pipe capable of flowing air or other fluids, wherein the walls of the pipe are made of a thermally conductive material.

Further, the thermally conductive braided fabric is fixed on a first pipe needing heat exchange by using methods such as welding, adhering with a thermally conductive adhesive and casting, and the thermally conductive braided fabric is surrounded by a second pipe at the same time; and there is a height difference between the two pipes.

Further, the thermally conductive braided fabric is respectively fixed on inner walls of two pipes; the inner walls of the two pipes are made of a heat-conductive material and are integrally connected or in close contact.

There is provided a LED lighting device, including the above apparatus for heat exchange by utilizing a braided fabric woven from a thermally conductive wire material, wherein a heating element of the LED lighting device is a LED chip, and the LED chip is fixed on the thermally conductive braided fabric.

Further, There is provided a LED lighting device, including the above apparatus for heat exchange by utilizing a braided fabric woven from a thermally conductive wire material, wherein the LED chip and the thermally conductive braided fabric are both enclosed in a ventilation passage including pipe walls made of a thermally conductive material, a blower causes an air flow to flow through a gap of the thermally conductive braided fabric to take heat away, then the air flow is cooled by the pipe walls made of the thermally conductive material in the ventilation passage and recirculated back to cool the thermally conductive braided fabric and the LED chip fixed thereon; and in this way, the air flow for cooling is enclosed in the ventilation passage, and isolated from the outside world, so as to avoid pollution or other influences.

There is provided a LED lighting device, including the above enclosed ventilation passage, wherein the enclosed ventilation passage includes a lampshade, a hollow lamppost or a support rod, and heat is dissipated mainly by utilizing the lamppost or the support rod; and in this way, the air flow for cooling is enclosed in the lampshade, the hollow lamppost or the support rod, and isolated from the outside world, so as to avoid pollution or other influences.

In general, the so-called cooling is eventuality always to dissipate heat to air. Whether convection or thermal radiation is related to the surface area of a heat dissipating surface of an object. Surface areas of a copper pillar and a copper wire bunch a volume of which is the same as that of the copper pillar may differ by multiples of tens or even hundreds. Therefore, heat generated by a heat generating element can be rapidly transferred to a largest heat dissipating surface with the shortest distance, so that the heat is effectively dissipated. Considering that it is difficult to use and process a pile of disordered thermally conductive wire materials, it is possible to conveniently weave the thermally conductive wire materials into a braided fabric as needed, especially when it has a metal frame, for further processing and use.

As another aspect of heat exchange, heat absorption is exactly the same.

In the present invention, the apparatus for heat exchange is changed from a usual large and bulky aluminum profile into a braided fabric made of a small amount of metal wires, which makes it possible to considerably reduce a weight and a volume. This should be a fundamental change to the apparatus for heat exchange. For instance, when a heat sink is used for dissipating heat from a LED, the weight and volume of the heat sink may be compressed by at least ten times, so that a heat dissipation problem that has been hindered rapid development of the LED is fundamentally solved.

The apparatus for heat exchange of the present invention may be used for dissipating heat from a LED chip, may also be used for dissipating heat from various electronics, and may further be used for dissipating heat from and exchanging it with devices such as a heater, an air-conditioner, a refrigerator and a water heater.

DESCRIPTION OF DRAWINGS

FIGS. 5A and 5B are schematic diagrams showing a structure of a LED street lamp with a power of 100 W;

wherein 1 represents a braided fabric made of a thermally conductive material, 2 represents an LED chip, 3 represents a blower, 4 represents a metal frame, 5 represents a first pipe, 6 represents a second pipe, 7 represents a lampshade, 8 represents a lamppost, and 9 represents a plastic pipe; and a unit of dimensioning is millimeter.

DETAILED DESCRIPTION OF EMBODIMENT

An object of the present invention is to provide an apparatus for heat exchange by utilizing a braided fabric woven from a thermally conductive wire material. The apparatus is characterized by including a thermally conductive braided fabric woven from a thermally conductive wire material with a diameter of more than 0.01 mm and less than 2 mm. The thermally conductive braided fabric 1 is fixed with a heat generating object or a heat absorbing object by means of methods such as welding, adhering with a thermally conductive adhesive and casting so as to ensure that heat may be effectively conducted between the heat generating object or the heat absorbing object and the thermally conductive material of the thermally conductive braided fabric 1, the heat is conducted on the thermally conductive wire material of the thermally conductive braided fabric 1, and air or other fluids are heated or cooled by means of a surface of the thermally conductive wire material, and the heat is dissipated or absorbed by convection.

A metal frame 4 may be formed on the thermally conductive braided fabric 1 of the present invention by using methods such as casting or welding, so as to maintain a certain shape and structure for other processing.

The apparatus for heat exchange according to the present invention is characterized in that an element required to be subjected to heat dissipation or absorption is fixed on a braided fabric or its metal frame by using methods such as welding and adhering with a thermally conductive adhesive so as to ensure that heat can be effectively conducted between the element required to be subjected to heat dissipation or absorption and the thermally conductive wire material of the braided fabric; the heat is conducted on the thermally conductive wire material of the braided fabric 1, and air or other fluids are heated or cooled by means of a surface of the thermally conductive wire material, the heat is dissipated or absorbed by convection, and heat dissipation or absorption of the element required to be subjected to heat dissipation or absorption is finally realized.

The apparatus for heat exchange according to the present invention is characterized in that the braided fabric made of the thermally conductive wire material forms a pocket-like structure along or together with other materials, a blower is installed at an opening of a pocket to supply air into the pocket and blow it from a gap of the braided fabric, such that a heat dissipating surface of the thermally conductive wire material of the braided fabric may greatly heat or cool air to realize effective heat dissipation or absorption.

The apparatus for heat exchange according to the present invention is characterized in that the braided fabric made of the thermally conductive wire material may be multilayer, and may have various structures. Air passes in or out from the gap of the thermally conductive wire material of the braided fabric to realize heat exchange; and the other materials forming the pocket may also have appropriate structures so as to ensure that the air can be uniformly blown from the braided fabric.

The apparatus for heat exchange according to the present invention is characterized in that the braided fabric is fixed on an outer wall of a pipe needing heat exchange by using methods such as welding, adhering with a thermally conductive adhesive and casting, the outer wall of the pipe is made of a thermally conductive material, a metal frame of the braided fabric may be a portion of the outer wall of the pipe, or may be in close contact with the thermally conductive material of the outer wall of the pipe, so as to ensure that heat can be effectively conducted between the pipe needing heat exchange and the thermally conductive wire material of the braided fabric; the heat is conducted on the thermally conductive wire material of the braided fabric, and air or other fluids which are in contact with a surface of the thermally conductive wire material are heated or cooled by means of the surface, the heat is dissipated or absorbed by convection, and heat exchange between the outer wall of the pipe and the air or other fluids outside the pipe is finally realized.

The apparatus for heat exchange according to the present invention is characterized in that the braided fabric made of the thermally conductive wire material is fixed on an inner wall of a pipe capable of circulating air or other fluids, the inner wall of the pipe is made of a thermally conductive material, a metal frame of the braided fabric may be a portion of the inner wall of the pipe, or may be in close contact with the thermally conductive material of the inner wall of the pipe, so as to ensure that heat can be effectively conducted between the pipe needing heat exchange and the thermally conductive wire material of the braided fabric; the heat is conducted on the thermally conductive wire material of the braided fabric, and air or other fluids which are in contact with a surface of the thermally conductive wire material are heated or cooled by means of the surface, the heat is dissipated or absorbed by convection, and heat exchange between the outer wall of the pipe and the air or other fluids inside the pipe is finally realized.

The apparatus for heat exchange according to the present invention is characterized in that the braided fabric made of the thermally conductive wire material is respectively fixed on an outer wall and an inner wall of a pipe capable of circulating air or other fluids, the walls of the pipe are made of a thermally conductive material, metal frames inside the pipe and outside the pipe as well as of the braided fabric may be in close contact with the thermally conductive material of the walls of the pipe, or may be a portion of the walls of the pipe, so as to ensure that heat can be effectively conducted between the pipe and the thermally conductive wire material of the braided fabric; the heat is conducted on the thermally conductive wire material of the walls of the pipe and that of the braided fabric at two sides of the pipe, and air or other fluids which are in contact with surfaces of the thermally conductive wire materials of the braided fabric inside and outside the walls of the pipe and the braided fabric at two sides of the pipe are heated or cooled by means of these surfaces, heat exchange with air or other fluids which are in contact with these surfaces is realized by convection, and finally the heat is conducted through the walls of the pipe, and heat exchange between the air or other fluids inside the pipe and the air or other fluids outside the pipe is realized.

Figure 4:
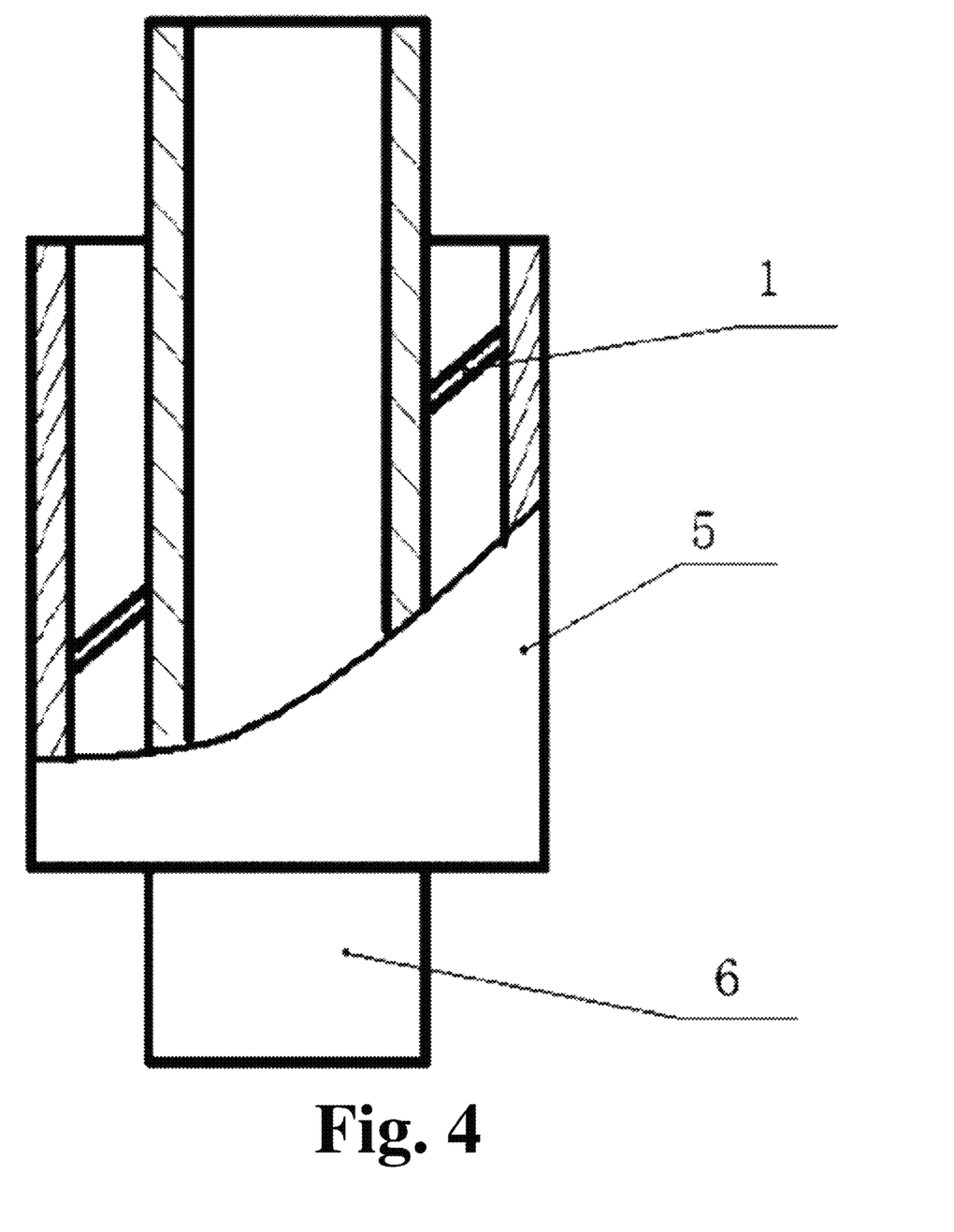
FIG. 4 is an apparatus for heat exchange according to claim 8.

The apparatus for heat exchange according to the present invention is characterized in that the braided fabric is fixed on a pipe 1 needing heat exchange by using methods such as welding, adhering with a thermally conduction adhesive and casting, and the whole braided fabric is in turn surrounded by another pipe 1; there is a height difference between an inlet and an outlet of the pipe 2, a differential pressure is produced by using a principle of thermal expansion and contraction of air to promote the air to circulate so as to realize convection and heat exchange; and the pipe 2 may be further provided with a blower, so as to enhance a heat exchange effect.

The apparatus for heat exchange according to the present invention is characterized in that the braided fabric made of the thermally conductive wire material is respectively fixed on inner walls of two pipes, the walls of the two pipes are made of a thermally conductive material, and are integrally connected or in close contact; metal frames of the braided fabric at two sides of each of the pipes are all in close contact with the thermally conductive material of the walls of each of the pipes, or may be a portion of the walls of the pipes, so as to ensure that heat can be effectively conducted between the pipes and the thermally conductive wire material of the braided fabric; the heat is conducted on the thermally conductive wire material of the walls of the pipes and that of the braided fabric at two sides of each of the pipes, and air or other fluids which are in contact with surfaces of the thermally conductive wire materials inside the walls of the two pipes and those of the respective braided fabric are heated or cooled by means of these surfaces, heat exchange with air or other fluids which are in contact with these surfaces is realized by convection, and finally the heat is conducted through the walls of the pipes, and heat exchange between the air or other fluids inside the two pipes and the air or other fluids outside the two pipes is realized.

The apparatus for heat exchange according to the present invention is characterized in that the LED chip and the thermally conductive braided fabric are both enclosed in a ventilation passage including pipe walls made of a thermally conductive material, a blower causes an air flow to flow through a gap of the thermally conductive braided fabric to take heat away, then the air flow is cooled by the pipe walls made of the thermally conductive material in the ventilation passage and recirculated back to cool the thermally conductive braided fabric and the LED chip fixed thereon; in this way, the air flow for cooling is enclosed in the ventilation passage, and isolated from the outside world, so as to avoid pollution or other influences.

The apparatus for heat exchange according to the present invention is characterized in that its closed ventilation passage includes a lampshade, a hollow lamppost or a support rod, and heat is dissipated mainly by utilizing the lamppost or the support rod; and in this way, the air flow for cooling is enclosed in the lampshade, the hollow lamppost or the support rod, and isolated from the outside world, so as to avoid pollution or other influences.

EMBODIMENT 1

A LED lamp with a power of 80 W

Figure 1:
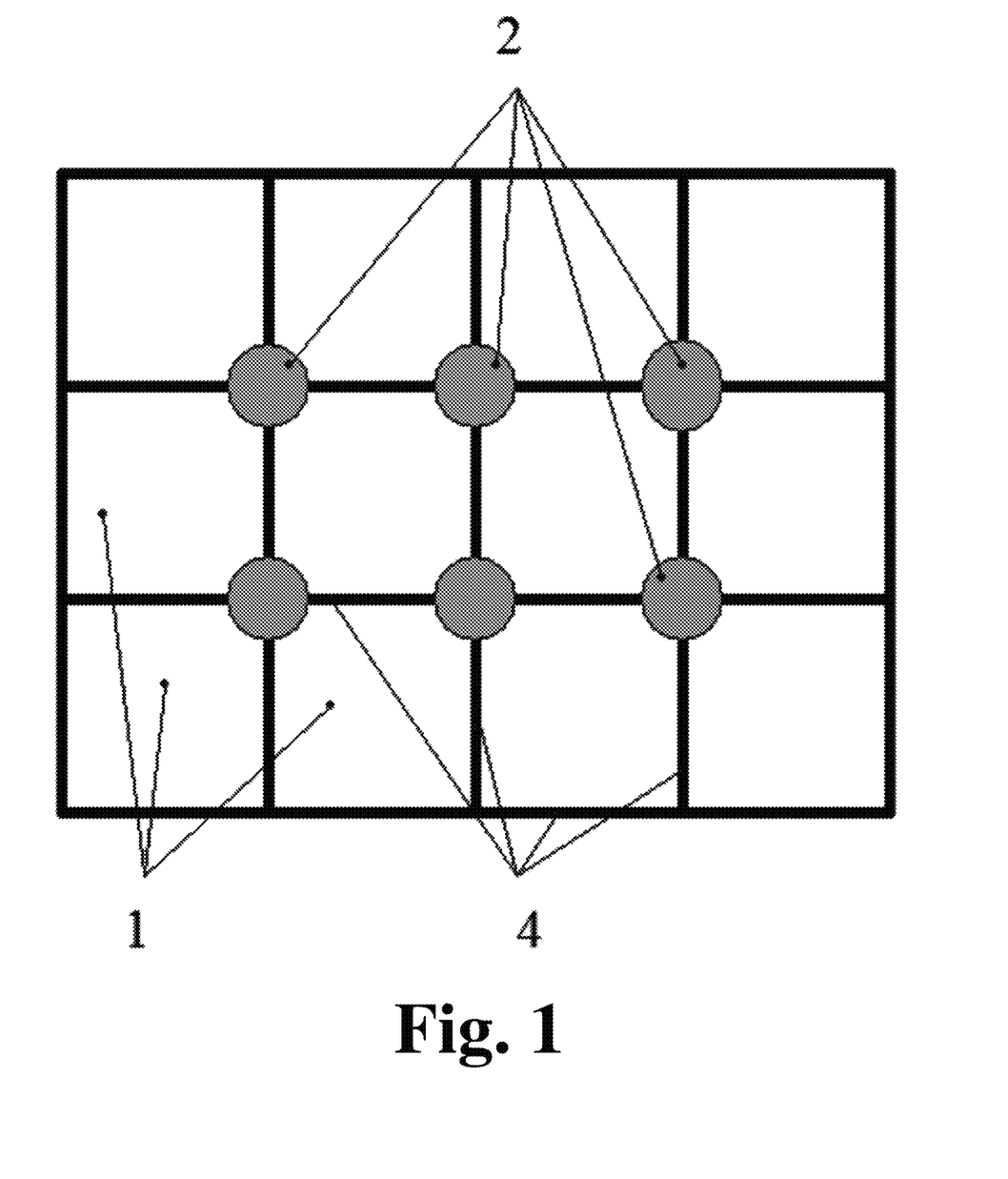
FIG. 1 is a die-cast metal frame and a LED chip on a braided fabric made of a copper wire.

On a thermally conductive fabric 1 woven from a copper wire, a metal frame 4 is formed by using a die-casting method to obtain a drum.

Figure 2:
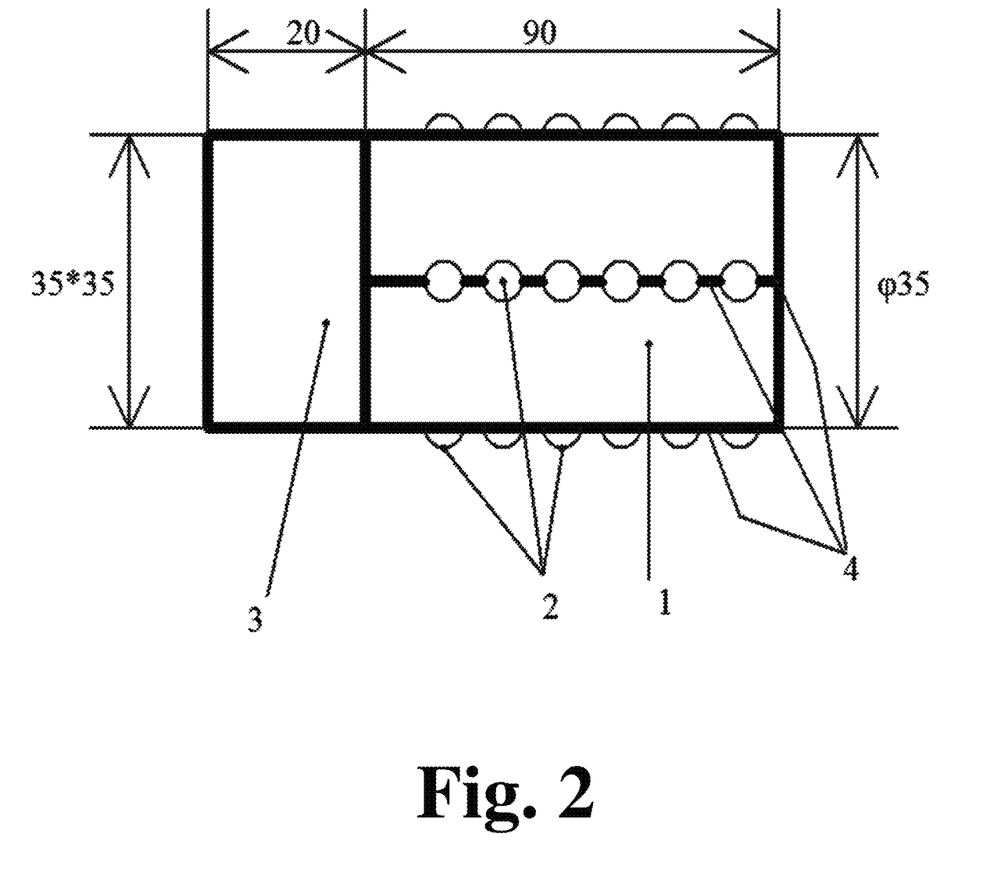
FIG. 2 is a structure of a LED lamp with a power of 80 W.

One end of the drum is blocked by using a braided strap or other materials, and the other end is connected with a blower 3. A LED chip 2 is adhered on the metal frame 2 by using a thermally conductive adhesive. The blower 3 and the LED chip 2 are connected to obtain a LED lamp with a power of 80 W.

Maximum dimensions of a length, a width and a height of this LED lamp are 100 (mm)×40 (mm)×40 (mm). (See FIG. 2)

During steady operation, a temperature rise of a heat dissipating surface (back face) of the LED chip ranges from 25 DEG C. to 28 DEG C.

EMBODIMENT 2

A LED lamp with a power of 40 W

Figure 3:
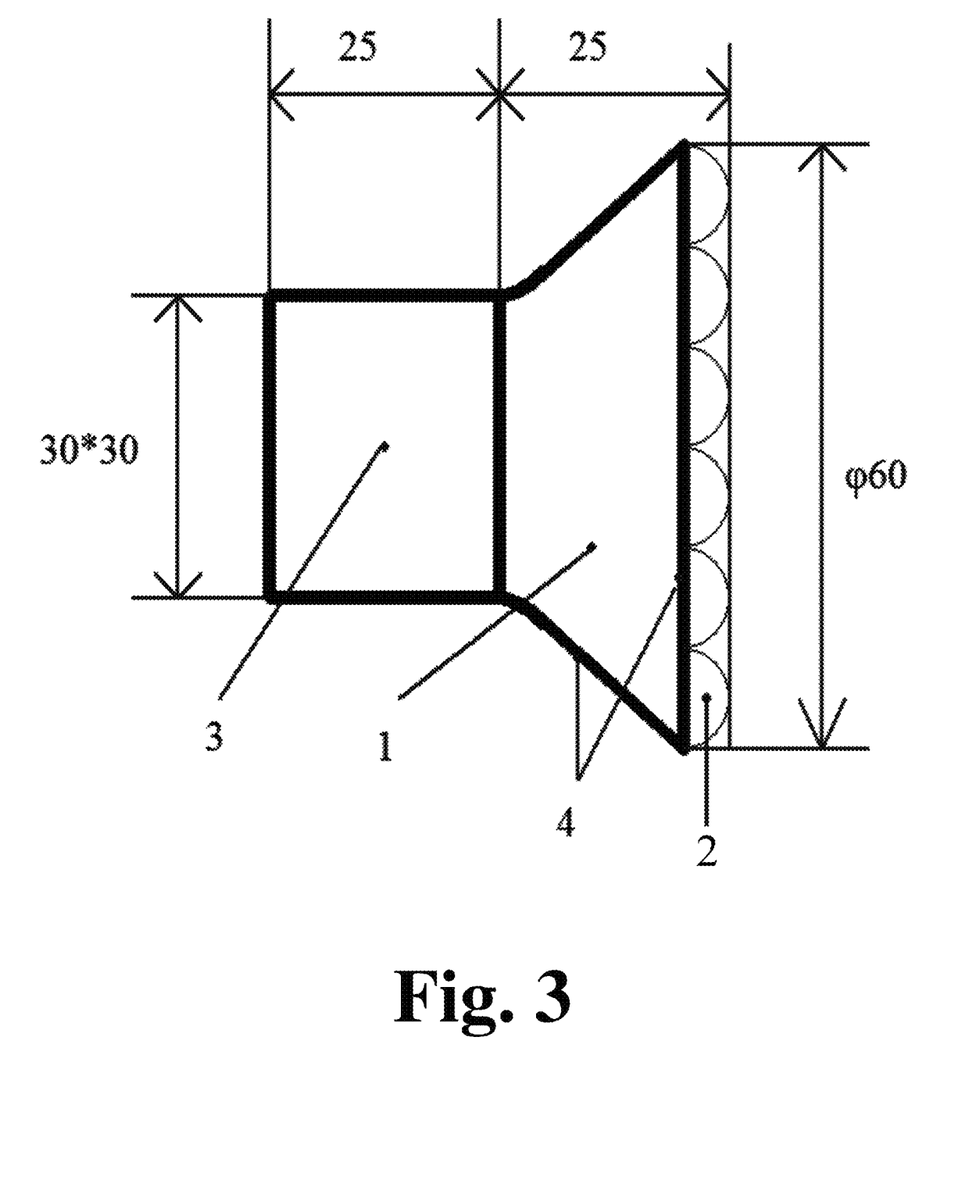
FIG. 3 is a structure of a LED lamp with a power of 40 W.

On a thermally conductive fabric 1 woven from a copper wire, a metal frame 4 is formed by using a die-casting method to obtain a frustoconical drum. One end of the frustoconical drum is blocked by using a braided strap and the other end is connected to a blower 3. A LED chip 2 is adhered on the metal frame by using a thermally conductive adhesive. The blower 3 and the LED chip 2 are connected to obtain a LED lamp with a power of 40 W.

A structure of this LED lamp is shown in FIG. 3.

During steady operation, a temperature rise of a heat dissipating surface (back face) of the LED chip is less than 25 DEG C.

EMBODIMENT 3

A thermally conductive braided fabric 1 woven from a copper wire is disposed between a first pipe body 5 and a second pipe body 6. Air passes through a gap between the first pipe body 5 and the second pipe body 6 to carry heat away from the thermally conductive braided fabric 1. Stable heat dissipation is realized.

EMBODIMENT 4

Figure 5A:
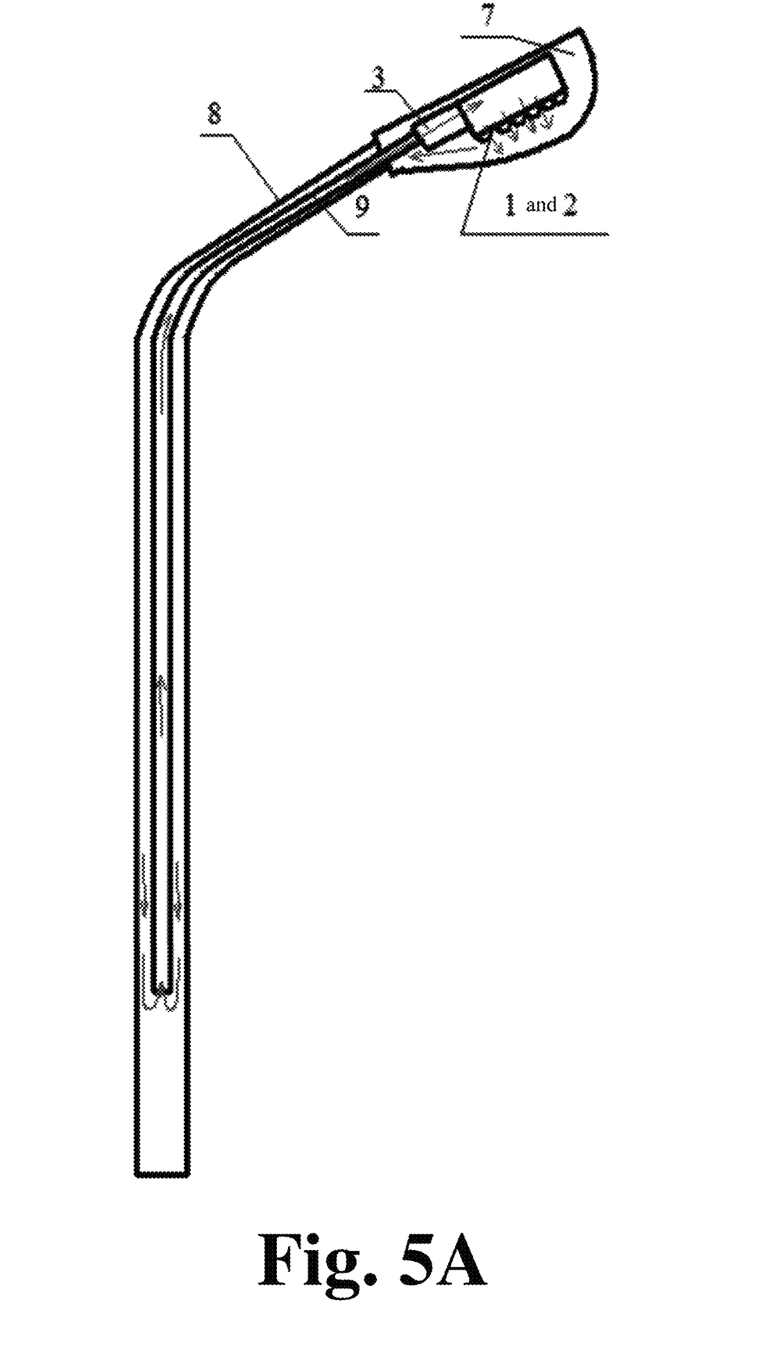
FIG. 5A is a lamppost, a lampshade and a LED lamp of a street lamp shade.
Figure 5B:
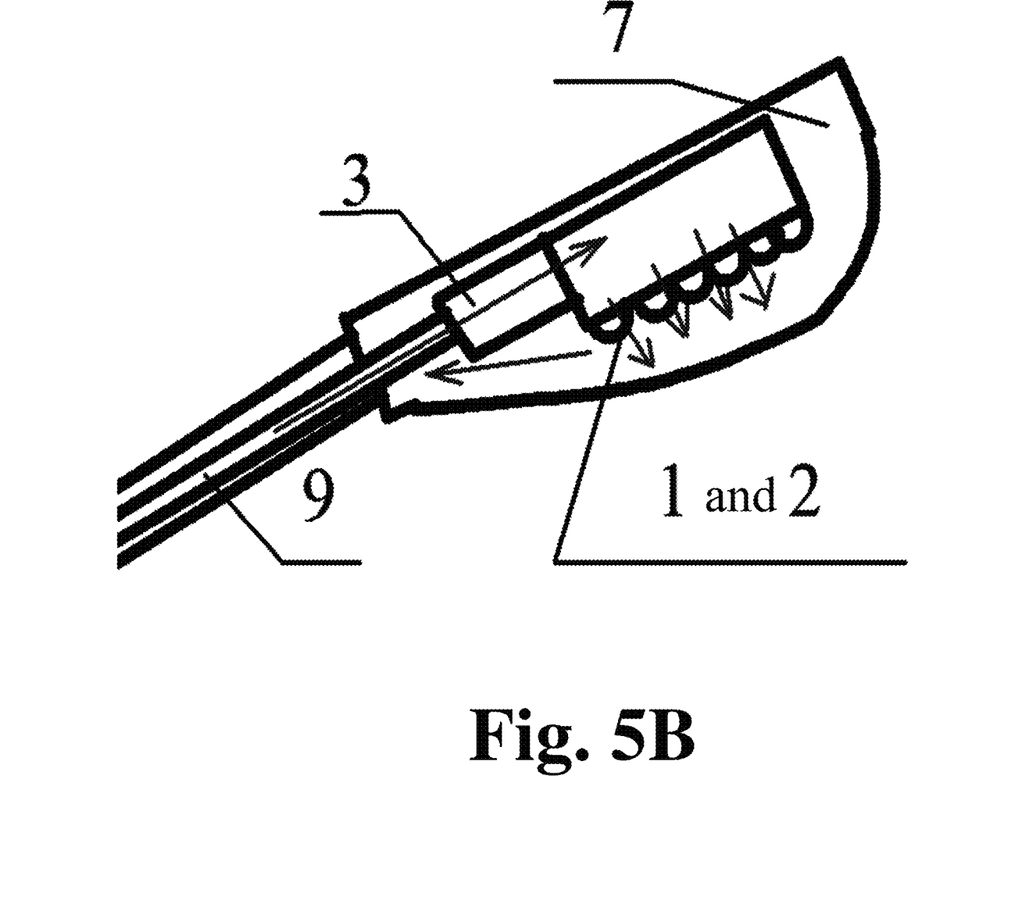
FIG. 5B is a lampshade and a LED lamp.

A LED street lamp with a power of 100 W. A lampshade, a hollow lamppost and a plastic pipe form an enclosed ventilation passage, and heat is dissipated mainly by utilizing the lamppost. A blower blows air away from a gap of a thermally conductive braided fabric, and the blown air enters the lamppost through the lampshade, the cooled air is recirculated back to the blower through the plastic pipe, so that a circularly cooled air flow is formed. In this way, the air flow for cooling is enclosed in the lampshade and the hollow lamppost, and isolated from the outside world, so as to avoid pollution and other influences on an outdoor environment.

What is claimed is:
1. An apparatus for heat exchange by utilizing a braided fabric woven from a thermally conductive wire, comprising:
 a thermally conductive braided fabric woven from a thermally conductive wire with a diameter d, wherein 0.01 mm≤d≤2 mm; and an element subject to heat dissipation or absorption connected onto the thermally conductive braided fabric by welding, adhering with a thermally conductive adhesive, or casting, wherein the thermally conductive braided fabric is affixed to an inner wall of a pipe for fluid circulation and the inner wall is made of a thermally conductive material, or wherein the thermally conductive braided fabric is affixed to an outer wall of the pipe, and the outer wall is made of the thermally conductive material, or wherein the thermally conductive braided fabric is respectively affixed to both the inner wall and the outer wall of the pipe, wherein both the inner wall and the outer wall of the pipe are made of the thermally conductive material.

2. The apparatus for heat exchange by utilizing a braided fabric woven from a thermally conductive wire material according to claim 1, comprising:

a thermally conductive braided fabric woven from a thermally conductive wire with a diameter d, wherein $0.01 \text{ mm} \leq d \leq 2 \text{ mm}$; and an element subject to heat dissipation or absorption connected onto the thermally conductive braided fabric by welding, adhering with a thermally conductive adhesive, or casting, wherein the thermally conductive braided fabric is affixed to a first pipe by welding, adhering with a thermally conductive adhesive, or casting, and the thermally conductive braided fabric is surrounded by a second pipe.

3. An apparatus for heat exchange by utilizing a braided fabric woven from a thermally conductive wire material according to claim 1, comprising:

a thermally conductive braided fabric woven from a thermally conductive wire having a diameter d, wherein $0.01 \text{ mm} \leq d \leq 2 \text{ mm}$; and an element subject to heat dissipation or absorption connected onto the thermally conductive braided fabric by welding, adhering with a thermally conductive adhesive, or casting, wherein the thermally conductive braided fabric is respectively affixed to inner walls of two pipes; the inner walls of the two pipes are made of a heat-conductive material and are integrally connected or in close contact.

\* \* \* \* \*